United States Patent
Xi et al.

(10) Patent No.: US 8,508,111 B1
(45) Date of Patent: Aug. 13, 2013

(54) DISPLAY PANEL AND METHOD FOR INSPECTING THEREOF

(75) Inventors: Peng-Bo Xi, Taipei (TW); Wen-Tai Chen, Tainan (TW); Tai-Kai Chen, Taoyuan County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 13/610,918

(22) Filed: Sep. 12, 2012

(30) Foreign Application Priority Data

Jun. 29, 2012 (TW) .............................. 101123477 A

(51) Int. Cl.
*H01J 1/00* (2006.01)
*H01J 19/00* (2006.01)

(52) U.S. Cl.
USPC ............................ 313/238; 313/240; 313/239

(58) Field of Classification Search
None
See application file for complete search history.

(56) References Cited

U.S. PATENT DOCUMENTS

| | | | |
|---|---|---|---|
| 6,493,047 B2 | 12/2002 | Ha | |
| 2005/0046439 A1 | 3/2005 | Yu | |
| 2011/0242065 A1* | 10/2011 | Hsu et al. | 345/204 |
| 2012/0081273 A1* | 4/2012 | Hsu et al. | 345/55 |
| 2012/0262430 A1* | 10/2012 | Ho et al. | 345/204 |

FOREIGN PATENT DOCUMENTS

| | | |
|---|---|---|
| CN | 101969043 | 2/2011 |
| TW | I223731 | 11/2004 |
| TW | I232946 | 5/2005 |
| TW | I287685 | 10/2007 |
| TW | 201011383 | 3/2010 |
| TW | 201020608 | 6/2010 |
| TW | I352963 | 11/2011 |

* cited by examiner

*Primary Examiner* — Natalie Walford
(74) *Attorney, Agent, or Firm* — Jianq Chyun IP Office

(57) ABSTRACT

A display panel and a method for inspecting thereof are provided. The display panel includes a first signal circuit, a second signal circuit and a plurality of first resistor. The first signal circuit includes a plurality of first signal lines which disposes in parallel along a first direction and electrically connects to one another. The second signal circuit includes a plurality of second signal lines disposing in parallel along the first direction, and the second signal lines and the first signal lines are alternately disposed in parallel. Each of second signal lines is connected to at least a first resistor. The interval between the first signal line and the second signal line is smaller than 60 μm and the difference between the resistances of the first signal line and the second signal line is ranged form 300 ohm to 30000 ohm.

33 Claims, 8 Drawing Sheets

DISPLAY PANEL AND METHOD FOR INSPECTING THEREOF

CROSS-REFERENCE TO RELATED APPLICATION

This application claims the priority benefit of Taiwan application serial no. 101123477, filed on Jun. 29, 2012. The entirety of the above-mentioned patent application is hereby incorporated by reference herein and made a part of this specification.

BACKGROUND OF THE DISCLOSURE

1. Field of the Disclosure

The present invention relates to a display panel and a method for inspecting thereof, and particularly to a display panel in which adjacent signal lines are adjusted to have different electrical properties and a method for inspecting a semi-finished display panel.

2. Description of Related Art

With advantages of being lighter, thinner and more compact, flat panel displays (FPD) have become the mainstream display products in recent years. Herein, the flat panel display has a display panel disposed thereto for displaying images via the display panel. In general, during the manufacturing process and before the display panels leaving the factory, an electrical inspection and light-on testing may be performed on the display panels in order to ensure the quality of the display panels. Herein, the electrical inspection may be performed just after the circuit layout of the display panels is completed, in order to confirm that the circuit layout has no defect.

During the electrical inspection, inspecting signals may be input to the circuit of the display panel and the electrical change of each circuit is measured, so as to determine whether there is open-circuit or short-circuit. With the development of the display technique and the improvement of the display panel resolution, the circuit of the display panel increases so that the width of the circuit line and the interval between the circuit lines become smaller. However, under the condition of the interval between the circuit lines being too small, the inspecting apparatus cannot accurately measure the electrical change of a single circuit line, accordingly the electrical inspection cannot be performed accurately on the circuit of the display panel.

SUMMARY OF THE DISCLOSURE

The present invention provides a display panel and a method for inspecting thereof, wherein electrical properties of each of the signal circuits are adjusted to be different from one another by disposing resistors, that is, electrical change may not be the same in different signal circuits, and thus the status of a single signal line of the adjacent signal lines can be accurately measured.

The present invention provides a display panel having a display region and a peripheral region located outside the display region, and the display region includes a plurality of pixel regions arranged in an array. The display panel includes a first signal circuit, a second signal circuit and a plurality of first resistors. The first signal circuit is disposed in the display region and the peripheral region. The first signal circuit includes a plurality of first signal lines disposed in parallel along a first direction, wherein the first signal lines are electrically connected to one another. The second signal circuit is disposed in the display region and the peripheral region. The second signal circuit includes a plurality of second signal lines disposed in parallel along the first direction, wherein the second signal lines and the first signal lines alternately disposed in parallel with one another. The first resistors are disposed in the peripheral region, and each of the second signal lines is connected to at least one of the first resistors, wherein an interval between the first signal line and the second signal line is smaller than 60 µm, and a difference between a first resistance of the first signal line and a second resistance of the second signal line is ranged from 30 ohm to 30000 ohm.

According to one exemplary embodiment of the present invention, the display panel further includes a plurality of pixel structures disposed in the corresponding pixel regions. Each of the pixel structures includes a display device and an active device. The active device is electrically connected to the display device and correspondingly and electrically connected to one of the second signal lines.

According to one exemplary embodiment of the present invention, the display panel includes an organic electro-luminescent device.

According to one exemplary embodiment of the present invention, the first signal circuit includes a power line circuit.

According to one exemplary embodiment of the present invention, the display panel further includes a plurality of pixel structures disposed in the corresponding pixel regions. Each of the pixel structures includes an active device and a transparent pixel electrode. The transparent pixel electrode is electrically connected to the active device and correspondingly and electrically connected to one of the second signal lines.

According to one exemplary embodiment of the present invention, the display panel further includes a plurality of first pads and a plurality of second pads located in the peripheral region. The first pads and the second pads electrically connect the first signal lines and the second signal lines, respectively.

The present invention further provides a method for performing electrically inspection on a semi-finished display panel. The display panel includes a substrate, a first signal circuit, a second signal circuit and a plurality of first resistors. The substrate has a display region and a peripheral region located outside the display region, and the display region includes a plurality of pixel regions arranged in an array. The first signal circuit is disposed in the display region and the peripheral region, wherein the first signal circuit includes a plurality of first signal lines disposed in parallel along a first direction, and the first signal lines are electrically connected to one another. The second signal circuit is disposed in the display region and the peripheral region, wherein the second signal circuit includes a plurality of second signal lines disposed in parallel along the first direction, and the second signal lines and the first signal lines are alternately disposed in parallel with one another. The first resistors are disposed in the peripheral region, and each of the second signal lines is connected to at least one of the first resistors, wherein an interval between the first signal line and the second signal line is smaller than 60 µm, and a difference between a first resistance of the first signal line and a second resistance of the second signal line is ranged from 30 ohm to 30000 ohm. The method includes: a first inspecting signal and a second inspecting signal are respectively input to the first signal circuit and the second signal circuit; and the electrical change of the second inspecting signals of the second signal lines is sequentially detected.

According to one exemplary embodiment of the present invention, before the first inspecting signal and a second inspecting signal are respectively input to the first signal circuit and the second signal circuit, the method further includes that an external resistor is electrically connected to each of the second signal lines.

According to one exemplary embodiment of the present invention, the display panel further includes a plurality of pixel structures disposed in the corresponding pixel regions. The method further includes: the pixel structures are driven by the first signal circuit and second signal circuit; and the status of the pixel structures is detected.

According to one exemplary embodiment of the present invention, the difference between the first resistance of the first signal line and the second resistance of the second signal line is ranged from 50 ohm to 1000 ohm.

According to one exemplary embodiment of the present invention, the difference between the first resistance of the first signal line and the second resistance of the second signal line is ranged from 100 ohm to 500 ohm.

According to one exemplary embodiment of the present invention, the display panel further includes a first bridge line located in the peripheral region and electrically connecting the first signal lines.

According to one exemplary embodiment of the present invention, the display panel further includes a second bridge line located in the peripheral region, wherein the first bridge line and the second bridge line are respectively located at two opposite sides of the display region, the first bridge line is electrically connected to a first end of each of the first signal lines, and the second bridge line is electrically connected to a second end of each of the first signal lines.

According to one exemplary embodiment of the present invention, the display panel further includes a plurality of second resistors located in the peripheral region, and respectively connected to the corresponding second signal lines in series, wherein each of the first resistors and each of the second resistors are electrically connected to two opposite ends of the corresponding second signal lines, respectively.

According to one exemplary embodiment of the present invention, a first resistance of each of the first resistors and a second resistance of each of the second resistors are substantially the same.

According to one exemplary embodiment of the present invention, the display panel further includes a third signal circuit and a plurality of third resistors. The third signal circuit is disposed in the display region and the peripheral region, wherein the third signal circuit includes a plurality of third signal lines disposed in parallel along the first direction, and the third signal lines and the first signal lines are alternately disposed in parallel with one another. The third resistors are disposed in the peripheral region, and each of the third signal lines is connected to at least one of the third resistors, wherein an interval between the first signal line and the third signal line is smaller than 60 μm, and a difference between a first resistance of the first signal line and a third resistance of the third signal line is ranged from 30 ohm to 30000 ohm.

According to one exemplary embodiment of the present invention, the difference between the first resistance of the first signal line and the third resistance of the third signal line is ranged from 50 ohm to 1000 ohm.

According to one exemplary embodiment of the present invention, the difference between the first resistance of the first signal line and the third resistance of the third signal line is ranged from 100 ohm to 500 ohm.

According to one exemplary embodiment of the present invention, the display panel further includes a plurality of fourth resistors located in the peripheral region and respectively connected to the corresponding third signal lines in series, wherein each of the third resistors and each of the fourth resistors are electrically connected to two opposite ends of the corresponding third signal line, respectively.

According to one exemplary embodiment of the present invention, a third resistance of each of the third resistors and a fourth resistance of each of the fourth resistors are substantially the same.

In order to make the aforementioned properties and advantages of the invention more comprehensible, embodiments accompanied with figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DETAILED DESCRIPTION OF THE EMBODIMENTS

Figure 1:
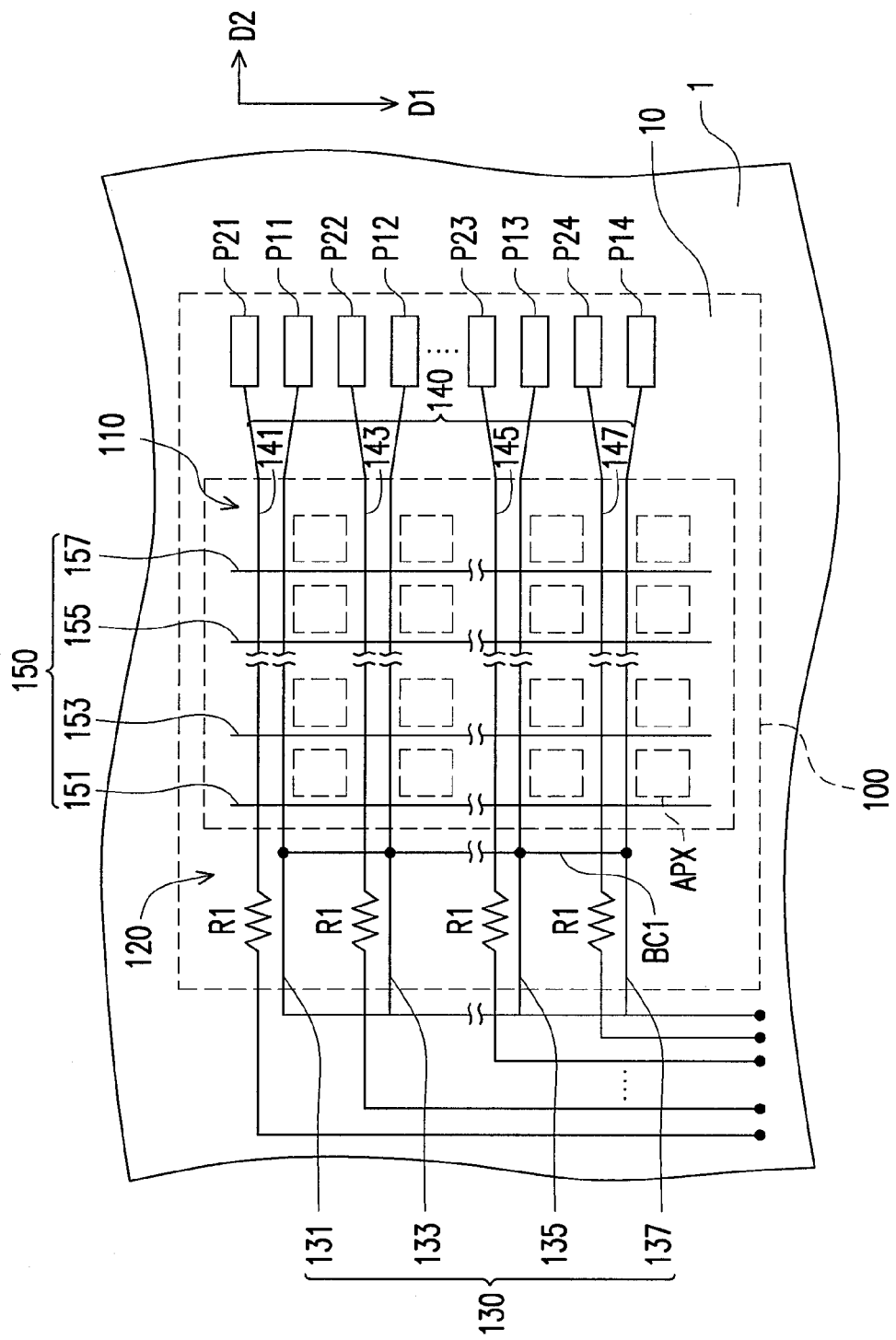
FIG. 1 is a schematic view of a portion of a semi-finished display panel according to a first exemplary embodiment of the present invention.

FIG. 1 is a schematic view of a portion of a semi-finished display panel according to a first exemplary embodiment of the present invention. Referring to FIG. 1, in general, during the manufacturing process of display panels, a mother substrate 1 is divided into a plurality of regions for fabricating display panels, and each region after cut corresponds to a substrate 10. Each of the substrate 10 corresponds to a complete display panel (for the sake of illustration of convenience, it is described as display panel 100 hereinafter), and after the cutting process (the cutting lines are represented by the dashed lines as shown in FIG. 1), each display panel 100 still includes the substrate 10, i.e., the substrate 10 may be the substrate of the display panel 100. In addition, before the assembling and the packaging of the display panel 100 are finished, the display panel 100 belongs to a semi-finished fabricating step (i.e., the semi-finished product of the display panel 100). The aforementioned is well known to one ordinary skilled in the art, and thus no further description is provided herein.

According to the present embodiment, the display panel 100 includes a display region 110 and a peripheral region 120 located outside the display region 110, namely, the substrate 10 has a display region 110 and a peripheral region 120. And the display panel 100 includes a first signal circuit 130, a second signal circuit 140 and a plurality of first resistors R1. The display panel 100 further includes a third signal circuit 150, a first bridge line BC1, a plurality of first pads (such as P11 to P14) and a plurality of second pads (such as P21 to P24).

The first signal circuit 130 is disposed in the display region 110 and the peripheral region 120, wherein the first signal circuit 130, i.e. a first signal line group, includes a plurality of first signal lines (e.g., 131, 133, 135, 137) disposed in parallel along a first direction D1, and the first signal lines (e.g., 131, 133, 135, 137) are electrically connected to one another. The second signal circuit 140 is disposed in the display region 110 and the peripheral region 120, wherein the second signal circuit 140, i.e. a second signal line group, includes a plurality of second signal lines (e.g., 141, 143, 145, 147) disposed in parallel along the first direction D1, and the second signal lines (e.g., 141, 143, 145, 147) and the first signal lines (e.g., 131, 133, 135, 137) are alternately disposed in parallel with one another. In addition, an interval between the first signal line (e.g., 131, 133, 135, 137) and the adjacent second signal line (e.g., 141, 143, 145, 147) is smaller than 60 μm.

The first resistors R1 are disposed in the peripheral region 120, and each of the second signal lines (e.g., 141, 143, 145, 147) is connected to at least one of the first resistors. However, in other embodiments, each of the second signal lines (e.g., 141, 143, 145, 147) may be connected to more than one first resistors R1, and the first resistors R1 corresponding to the same second signal line (e.g., 141, 143, 145, 147) may be connected in series or parallel, and the present embodiment is not limited thereto. In the present embodiment, the first resistors R1 are electrically connected to the same ends of the corresponding second signal lines (e.g., 141, 143, 145, 147), but in other embodiments, the first resistors R1 may be connected to the two ends of any of the corresponding second signal lines (e.g., 141, 143, 145, 147), and the present embodiment is not limited thereto.

The third signal circuit 150 is disposed in the display region 110 and the peripheral region 120, wherein the third signal circuit 150 includes a plurality of third signal lines (e.g., 151, 153, 155, 157) disposed in parallel along a second direction D2, and the third signal lines (e.g., 151, 153, 155, 157) cross over the second signal lines (e.g., 141, 143, 145, 147) and the first signal lines (e.g., 131, 133, 135, 137), so as to form a plurality of pixel regions APX arranged in an array. The third signal circuit 150 may be selectively fabricated before or after the detecting process of the first signal circuit 130 and the second signal circuit 140, and the present embodiment is not limited thereto.

The first signal lines (e.g., 131, 133, 135, 137) may be electrically connected with one another through the first bridge line BC1 located in the peripheral region 120 or the display region 110, or through a circuit device outside the display panel 100, such that the electrical properties of the first signal lines (e.g., 131, 133, 135, 137) are more consistent. Moreover, a plurality of first pads (e.g., P11 to P14) and a plurality of second pads (e.g., P21 to P24) may be selectively disposed in the peripheral region 120. The first pads (e.g., P11 to P14) and the second pads (e.g., P21 to P24) are electrically connected to the first signal lines (e.g., 131, 133, 135, 137) and the second signal lines (e.g., 141, 143, 145, 147), respectively. For instance, the first pad P11 is electrically connected to the first signal line 131, and the second pad P21 is electrically connected to the second signal line 141. The first signal lines (e.g., 131, 133, 135, 137) and the second signal lines (e.g., 141, 143, 145, 147) may be detected by electrical coupling sensing method, or detected by electrical contact detection method via the first pads (e.g., P11 to P14) and the second pads (e.g., P21 to P24).

Since each of the second signal lines (e.g., 141, 143, 145, 147) is connected to one of the first resistors R1, the resistance of the first signal lines (e.g., 131, 133, 135, 137) may be different from that of the second signal lines (e.g., 141, 143, 145, 147). Namely, there is a difference between the resistance of the first signal lines (e.g., 131, 133, 135, 137) and the resistance of the second signal lines (e.g., 141, 143, 145, 147). For instance, each of the first signal lines (e.g., 131, 133, 135, 137) has a first resistance, while each of the second signal lines (e.g., 141, 143, 145, 147) has a second resistance, and the first resistance and the second resistance are different as above mentioned. In the present embodiment, through the setting of the resistance of the first resistors R1, the difference between the resistance of each of the first signal lines (e.g., 131, 133, 135, 137) and the resistance of each of the second signal lines (e.g., 141, 143, 145, 147) is ranged from 30 ohm to 30000 ohm, for example. However, in another embodiment, the difference between the resistance of the first signal lines (e.g., 131, 133, 135, 137) and the resistance of each of the second signal lines (e.g., 141, 143, 145, 147) may be ranged from 50 ohm to 1000 ohm; or, the difference between the resistance of the first signal lines (e.g., 131, 133, 135, 137) and the resistance of the second signal lines (e.g., 141, 143, 145, 147) is ranged from 100 ohm to 500 ohm, which can be decided by people having ordinary skill in the art, and the present invention is not limited thereto.

Since the resistance of the first signal lines (e.g., 131, 133, 135, 137) is different from that of the second signal lines (e.g., 141, 143, 145, 147), after the first inspecting signal is input to the first signal lines (e.g., 131, 133, 135, 137) and the second inspecting signal is input to the second signal lines (e.g., 141, 143, 145, 147), the electrical change detected in the first signal lines (e.g., 131, 133, 135, 137) may be significantly different from the electrical change detected in the second signal lines (e.g., 141, 143, 145, 147). For instance, the change of the voltage level induced by the generated open-circuit or short-circuit of the second signal lines (e.g., 141, 143, 145, 147) and the change of the voltage level induced by the generated open-circuit or short-circuit of the first signal lines (e.g., 131, 133, 135, 137) are not the same. Herein, the electrical change of the second inspecting signal input to the second signal lines (e.g., 141, 143, 145, 147) can be sequentially detected, and the present invention is not limited thereto.

Figure 10A:
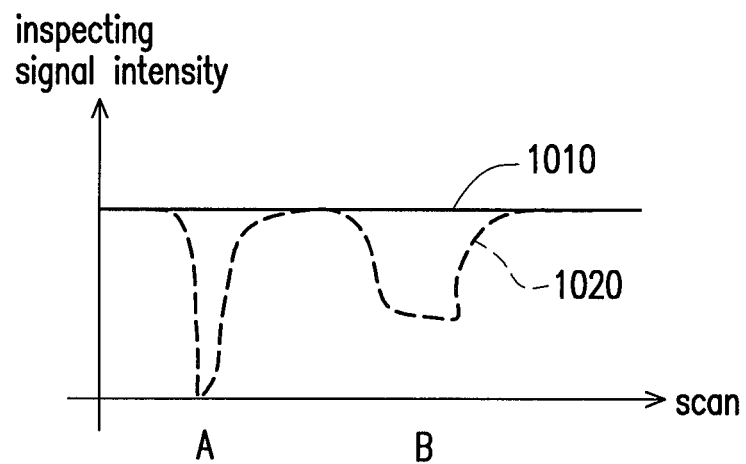
FIG. 10A and FIG. 10B are schematic views respectively illustrating a waveform of a detecting signal according to one exemplary embodiment of the present invention.
Figure 10B:
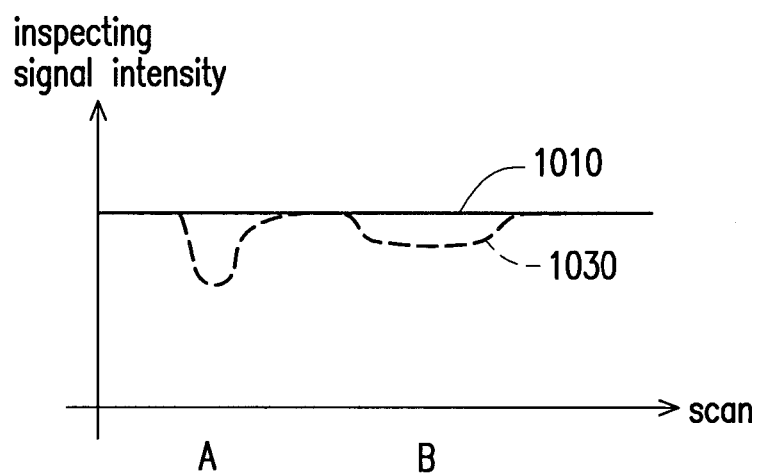

Since there is a sufficient difference between the resistance of the first signal lines (e.g., 131, 133, 135, 137) and the resistance of the second signal lines (e.g., 141, 143, 145, 147), the second signal lines (e.g., 141, 143, 145, 147) may not be affected by the interference of the first signal lines (e.g., 131, 133, 135, 137), and thus a more significant detecting signal may be obtained during the detecting process. FIG. 10A illustrates one exemplary embodiment of the present invention, wherein there is a sufficient difference between the resistance of the first signal line (e.g., 131) and the resistance of the second signal line (e.g., 141). The figure illustrates the sensing signal during detecting: A represents the sensing signal when the second signal line (e.g., 141) is open-circuit, and B represents the sensing signal when short-circuit occurs between the second signal line (e.g., 143) and the adjacent first signal line (e.g., 133). FIG. 10B illustrates one comparative example of the present invention, wherein there is no difference between the resistance of the first signal line and the resistance of the second signal line. The figure illustrates the sensing signal during detecting: A represents the sensing signal when the second signal line is open-circuit, and B represents the sensing signal when short-circuit occurs between the second signal line and the adjacent first signal line (e.g., 133). Herein the horizontal axis of FIG. 10A and FIG. 10B may be the scanning direction.

In FIG. 10A and FIG. 10B, the waveform 1010 corresponds to an ideal sensing signal, while the waveforms 1020 and 1030 are the actual measured sensing signals. Significantly, as shown in the waveform 1020 in FIG. 10A, in one embodiment of the present invention, if there is a sufficient difference between the resistance of the second signal lines (e.g., 141, 143, 145, 147) and the resistance of the first signal lines (e.g., 131, 133, 135, 137), the sensing signals may be significant in spite of an open-circuit or short-circuit. Therefore, the defect of the aforementioned open-circuit or short-circuit can be inspected more easily, and the yield of the products can be further increased. On the contrary, as shown in the waveform 1030 in FIG. 10B, in one embodiment of the present invention, if there is no difference between the resistance of the second signal lines and the resistance of the first signal lines, the sensing signals may not be significant in spite of an open-circuit or short-circuit. Therefore, misjudgment or no sensing signal being measured is likely to occur in the inspection, and the defect of the aforementioned open-circuit or short-circuit may not be properly inspected. Thus, the yield of the products is limited.

In one embodiment of the present invention, taking the organic electro-luminescent display device as an example, the first signal lines (e.g., 131, 133, 135, 137) may be power lines, i.e., the first signal circuit 130 may comprise a power line circuit. The second signal lines (e.g., 141, 143, 145, 147) may be gate lines, i.e., the second signal circuit 140 may comprise a gate line circuit. Herein, the third signal lines (e.g., 151, 153, 155, 157) may be data lines, i.e., the third signal circuit 150 may comprise a data line circuit. Or, the second signal circuit 140 and the third signal circuit 150 may be interchanged. The second signal lines (e.g., 141, 143, 145, 147) may be the data lines, i.e., the second signal circuit 140 may include a data line circuit. Herein the third signal lines (e.g., 151, 153, 155, 157) may be the gate lines, i.e., the third signal circuit 150 may comprise a gate line circuit. It is certain that the present invention should not be construed as limited to the embodiment described above.

In addition, in other embodiments of the present invention, taking the liquid crystal display device as an example, the first signal lines (e.g., 131, 133, 135, 137) may be the common lines, i.e., the first signal circuit 130 may comprise a common voltage circuit. The second signal lines (e.g., 141, 143, 145, 147) may be gate lines, i.e., the second signal circuit 140 may comprise a gate line circuit. Herein, the third signal lines (e.g., 151, 153, 155, 157) may be data lines, i.e., the third signal circuit 150 may comprise a data line circuit. Or, the second signal circuit 140 and the third signal circuit 150 may be interchanged. The second signal lines (e.g., 141, 143, 145, 147) may be the data lines, i.e., the second signal circuit 140 may comprise a data line circuit. Herein, the third signal lines (e.g., 151, 153, 155, 157) may be the gate lines, i.e., the third signal circuit 150 may comprise a gate line circuit. It is certain that the present invention should not be construed as limited to the embodiment described above.

Additionally, if the interval between the line width of the third signal circuit 150 and the first signal circuit 130 is too close, the above mentioned circuit configuration of the first signal circuit 130 and the second signal circuit 140 can be referred to, so as to differentiate the electrical properties of the third signal circuit 150 from the electrical properties of the first signal circuit 130, and it is not repeated herein.

Figure 2:
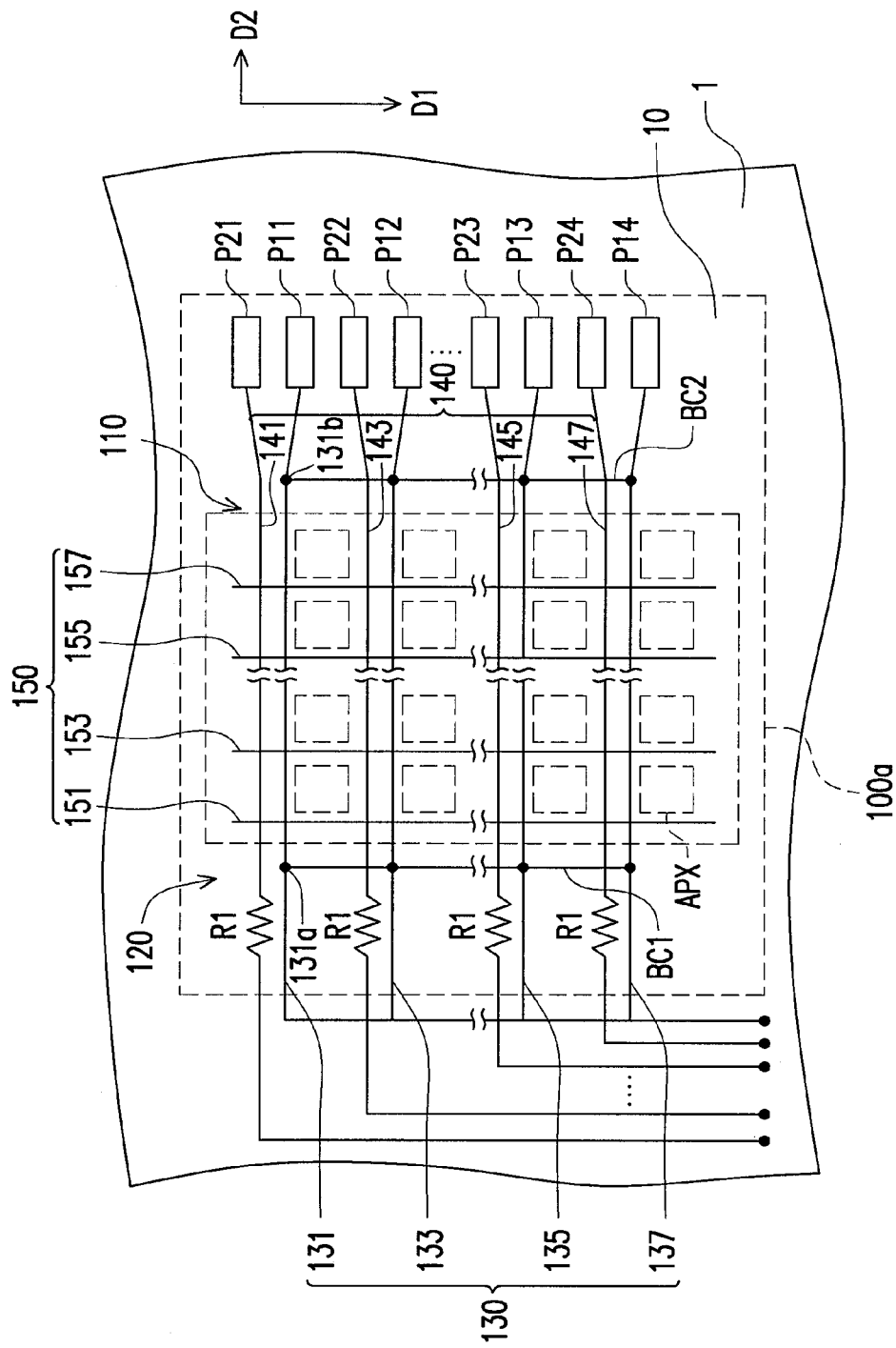
FIG. 2 is a schematic view of a portion of a semi-finished display panel according to a second exemplary embodiment of the present invention.

FIG. 2 is a schematic view of a portion of a semi-finished display panel according to a second exemplary embodiment of the present invention. Referring to FIG. 1 and FIG. 2, in the present embodiment, the display panel 100a is substantially the same to the display panel 100, the difference is that the display panel 100a further includes a second bridge line BC2. In the embodiment, the second bridge line BC2 is located in the peripheral region 120, and both the first bridge line BC1 and the second bridge line BC2 are electrically connect the first signal lines (e.g., 131, 133, 135, 137), but the first bridge line BC1 and the second bridge line BC2 are respectively located at the two opposite sides of the display region 110. In other words, the first bridge line BC1 electrically connects the first end (e.g., 131a) of each of the first signal lines (e.g., 131, 133, 135, 137), and the second bridge line BC2 electrically connects the second end (e.g., 131b) of each of the first signal lines (e.g., 131, 133, 135, 137). Accordingly, the consistency of electrical properties of the first signal lines (e.g., 131, 133, 135, 137) can be improved.

Figure 3:
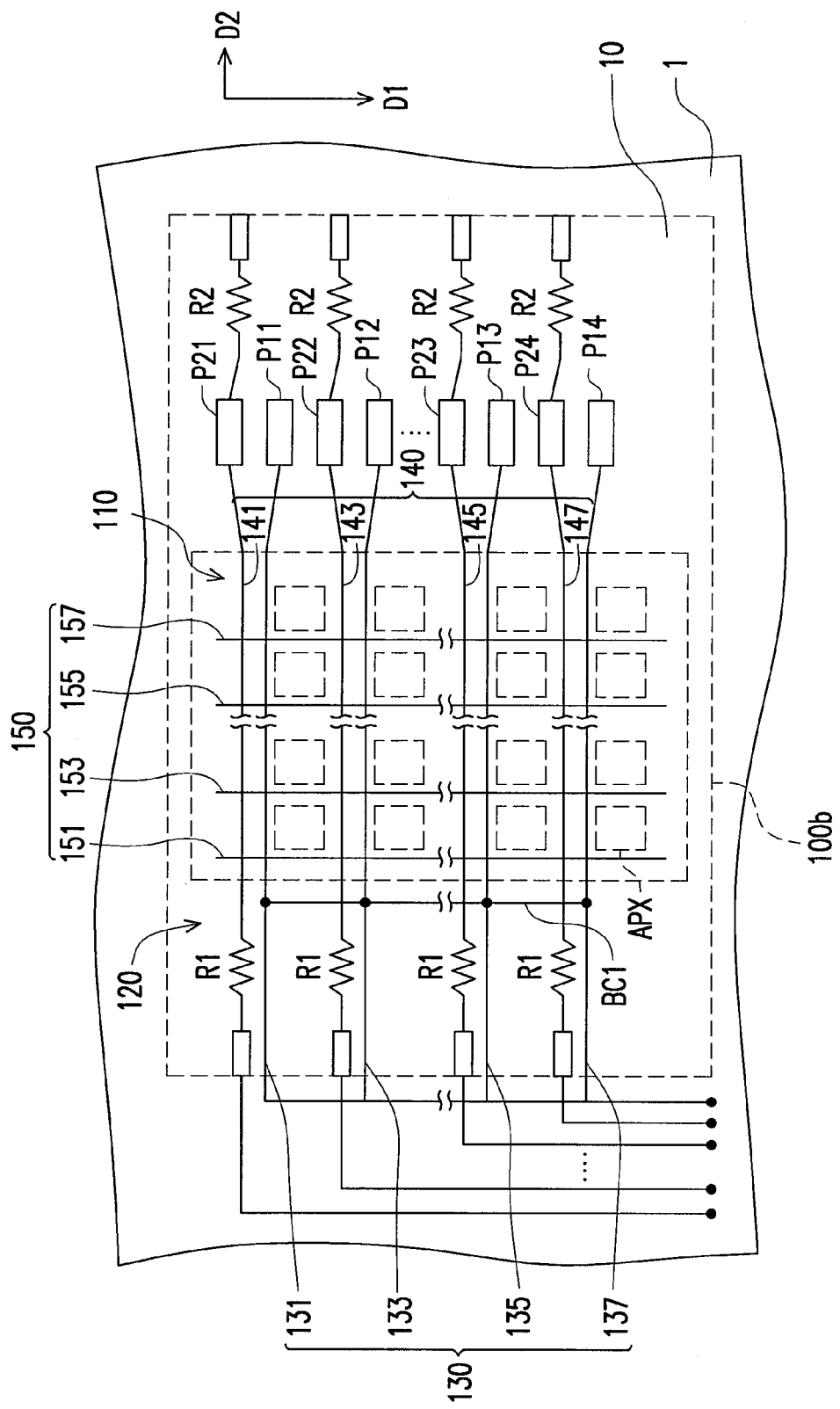
FIG. 3 is a schematic view of a portion of a semi-finished display panel according to a third exemplary embodiment of the present invention.

FIG. 3 is a schematic view of a portion of a semi-finished display panel according to a third exemplary embodiment of the present invention. Referring to FIG. 1 and FIG. 3, in the present embodiment, the display panel 100b is substantially the same to the display panel 100, the difference is that the display panel 100b further includes a plurality of second resistors R2. In the embodiment, the second resistors R2 are located in the peripheral region 120 and respectively connected to the corresponding second signal lines (e.g., 141, 143, 145, 147) in series through the corresponding second pads (e.g., P21 to P 24). In other words, each first resistor R1 and each corresponding second resistor are respectively and electrically connected the two opposite ends of the same second signal line (e.g., 141, 143, 145, 147).

In the embodiment, in order to consider the balance of resistance and capacitance load, the resistance of the first resistor R1 and the resistance of the second resistor R2 may substantially be the same, so that if each second signal line (e.g., 141, 143, 145, 147) of the display panel 100b is a double-ended input, the driving signals input via the two ends of the second signal line (e.g., 141, 143, 145, 147) may be the same.

Furthermore, in the present embodiment, the second resistors R2 are located in the peripheral region 120, but in other embodiments, the second resistors R2 may be located outside the display panel 100b. After the cutting process of the display panel 100b, the second resistors R2 may be disposed on an auxiliary substrate located outside the display panel 100b, in order that the resistance and capacitance load of the display panel 100b can be balanced, wherein the auxiliary substrate is a flexible printed circuit (FPC) board or printed circuit board (PCB), for example.

Since each of the second signal lines (e.g., 141, 143, 145, 147) is connected to the corresponding first resistors R1 and the corresponding second resistors R2 in series, the resistance of the first signal lines (e.g., 131, 133, 135, 137) may be different from that of the second signal lines (e.g., 141, 143, 145, 147). Therefore, the detected electrical change of the first inspecting signal of the first signal lines (e.g., 131, 133, 135, 137) may be different from the detected electrical change of the second inspecting signal of the second signal lines (e.g., 141, 143, 145, 147).

Figure 4:
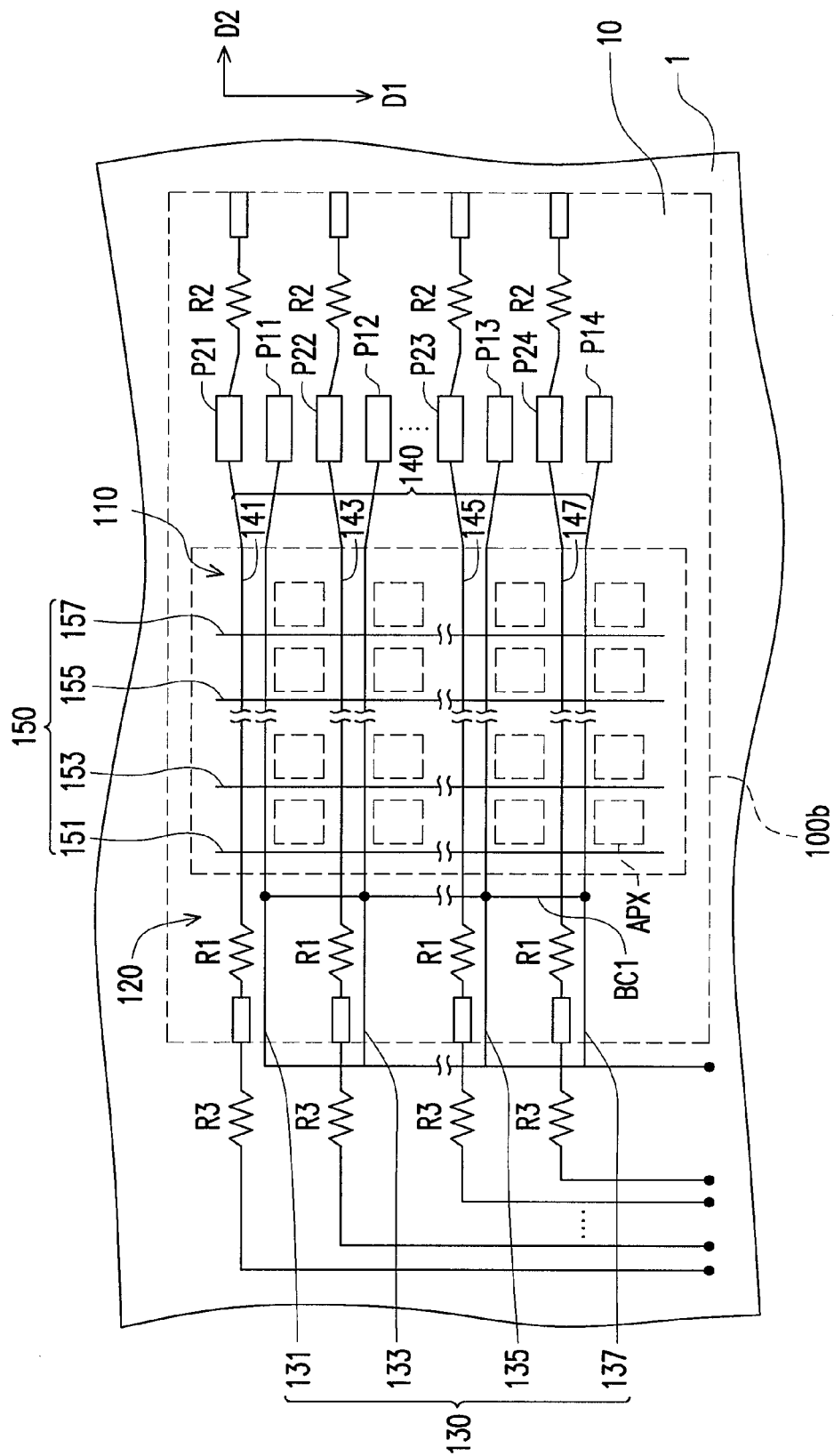
FIG. 4 is a schematic view of a portion of a semi-finished display panel according to a fourth exemplary embodiment of the present invention.

FIG. 4 is a schematic view of a portion of a semi-finished display panel according to a fourth exemplary embodiment of the present invention. Referring to FIG. 3 and FIG. 4, in the present embodiment, comparing the structure illustrated in FIG. 4 to the structure illustrated in FIG. 3, the difference is that the mother substrate 1 further includes a plurality of third resistors R3. The third resistors R3 are located outside the display panel 100*b*, i.e., as for the display panel 100*b* the third resistors R3 are external resistors respectively connected in series to the corresponding second signal lines (e.g., 141, 143, 145, 147) via the corresponding first resistors R1. In addition, by setting the resistance of each third resistor R3, the electrical properties of the first signal lines (e.g., 131, 133, 135, 137) may be differentiated from the electrical properties of the second signal lines (e.g., 141, 143, 145, 147). Moreover, the third resistors R3 are located outside the display panel 100*b*, thus after the cutting process of the display panel 100*b*, the third resistors R3 may not affect the balance of the resistance and capacitance load of the display panel 100*b*.

Figure 5:
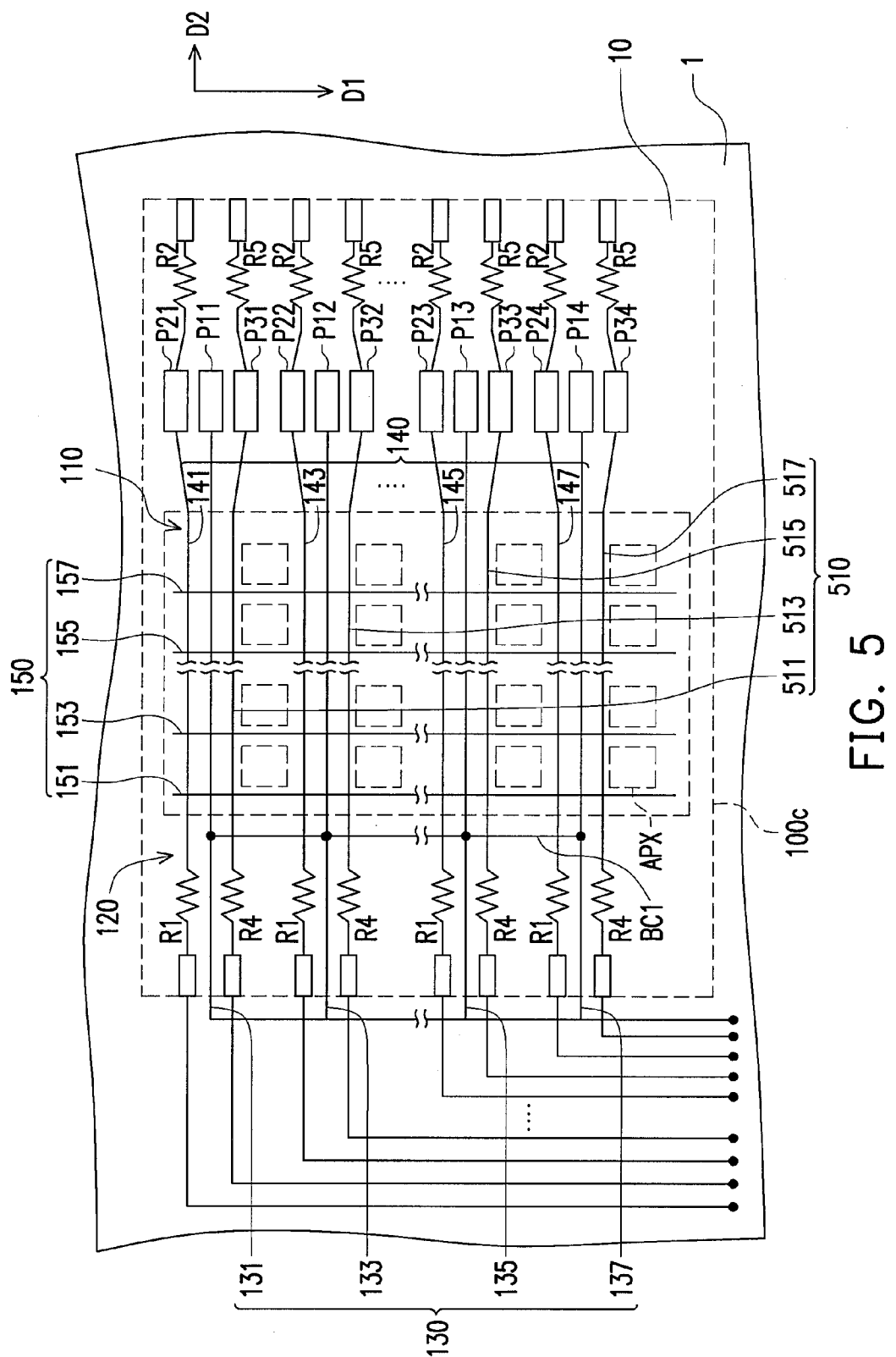
FIG. 5 is a schematic view of a portion of a semi-finished display panel according to a fifth exemplary embodiment of the present invention.

FIG. 5 is a schematic view of a portion of a semi-finished display panel according to a fifth exemplary embodiment of the present invention. Referring to FIG. 3 and FIG. 5, in the present embodiment, the display panel 100*c* is substantially the same to the display panel 100*b*, the difference is that the display panel 100*c* further includes a fourth signal circuit 510, a plurality of fourth resistors R4, a plurality of fifth resistors R5 and a plurality of third pads (e.g., P31 to P34). The fourth signal circuit 510 is disposed in the display region 110 and the peripheral region 120. The fourth signal circuit 510 includes a plurality of fourth signal lines (e.g., 511, 513, 515, 517) disposed in parallel along the first direction D1. Herein the fourth signal lines (e.g., 511, 513, 515, 517) and the first signal lines (e.g., 131, 133, 135, 137) are alternately disposed in parallel with one another, and the interval between each of the first signal line (e.g., 131, 133, 135, 137) and the adjacent fourth signal line (e.g., 511, 513, 515, 517) is smaller than 60 µm.

The fourth resistors R4 are disposed in the peripheral region 120, and each of the fourth signal lines (e.g., 511, 513, 515, 517) is connected to one of the fourth resistors R4. However, in other embodiments, each of the fourth signal lines (e.g., 511, 513, 515, 517) may be connected to more than one fourth resistors R4, and the fourth resistors R4 corresponding to the same fourth signal line (e.g., 511, 513, 515, 517) may be connected in series or parallel, and the present embodiment is not limited thereto.

In the present embodiment, the fifth resistors R5 are located in the peripheral region 120 and respectively connected to the corresponding fourth signal lines (e.g., 511, 513, 515, 517) in series through the corresponding third pads (e.g., P31 to P34), wherein each third pad (e.g., P31 to P34) is electrically connects the corresponding fourth signal line (e.g., 511, 513, 515, 517). In other words, each fourth resistor R4 and each corresponding fifth resistor are respectively and electrically connected the two opposite ends of the same fourth signal line (e.g., 511, 513, 515, 517). In addition, in order to consider the balance of resistance and capacitance load, the resistance of the fourth resistor R4 and the resistance of the fifth resistor R5 may substantially be the same, so that if each fourth signal line (e.g., 511, 513, 515, 517) of the display panel 100*c* is a double-ended input, the driving signals input via the two ends of the fifth signal line (e.g., 511, 513, 515, 517) may be the same.

In the present embodiment, the fifth resistors R5 are located in the peripheral region 120, but in other embodiments, the fifth resistors R5 may be located outside the display panel 100*c*. After the cutting process of the display panel 100*c*, the fifth resistors R5 may be disposed on an auxiliary substrate located outside the display panel 100*c*, in order that the resistance and capacitance load of the display panel 100*c* can be balanced, wherein the auxiliary substrate is a flexible printed circuit (FPC) board or printed circuit board (PCB), for example.

In the present embodiment, through the setting of the resistance of the fourth resistors R4 and fifth resistors R5, the difference between the resistance of each of the first signal lines (e.g., 131, 133, 135, 137) and the resistance of each of the fourth signal lines (e.g., 511, 513, 515, 517) is ranged from 30 ohm to 30000 ohm, for example. However, in another embodiment, the difference between the resistance of the first signal lines (e.g., 131, 133, 135, 137) and the resistance of each of the fourth signal lines (e.g., 511, 513, 515, 517) may be preferably ranged from 50 ohm to 1000 ohm. Or, it may be set that the difference between the resistance of the first signal lines (e.g., 131, 133, 135, 137) and the resistance of the fourth signal lines (e.g., 511, 513, 515, 517) is preferably ranged from 100 ohm to 500 ohm. It can be decided according to people having ordinary skill in the art, and the present embodiment is not limited thereto.

In the present embodiment, the two opposite ends of each of the fourth signal lines (e.g., 511, 513, 515, 517) are respectively and electrically connected by the corresponding fourth resistor R4 and the corresponding fifth resistor R5. However, under the condition of without considering the balance of resistance and capacitance load, the disposition of the fifth resistors R5 may be omitted. Namely, in other embodiments, each of the fourth signal lines (e.g., 511, 513, 515, 517) may only electrically connected to the corresponding fourth resistor R4, and by setting the resistance of the fourth resistors R4, a difference of resistance may formed between the resistances of the first signal lines (e.g., 131, 133, 135, 137) and fourth signal lines (e.g., 511, 513, 515, 517).

Figure 6:
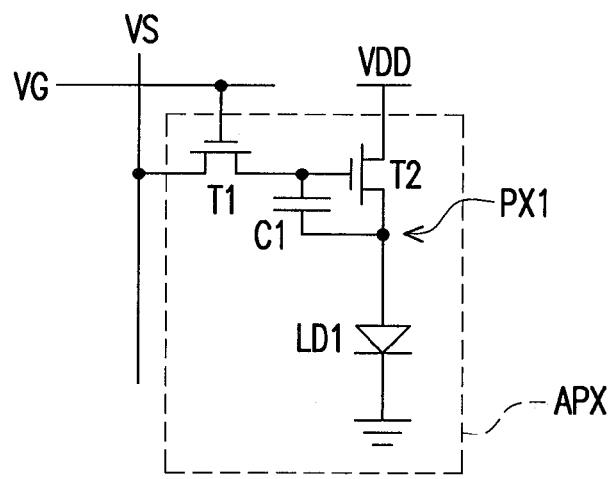
FIG. 6 is a schematic view of a pixel structure of a display panel according to one exemplary embodiment of the present invention.

FIG. 6 is a schematic view of a pixel structure of a display panel according to one exemplary embodiment of the present invention. Taking the display panel of the organic electro-luminescent display device as an example, referring to FIG. 1 and FIG. 6, in the present embodiment, a pixel structure PX1 is disposed in each of the pixel regions APX. Each of the pixel structures PX1 includes a plurality of active devices (e.g., transistors T1, T2), a capacitor C1 and a display device (e.g., organic electro-luminescent device LD1). The drain of the transistor T1 receives the corresponding source driving voltage VS, and the gate of the transistor T1 receives the corresponding gate driving voltage VG. The drain of the transistor T2 receives the system voltage VDD, and the gate of the transistor T2 is electrically connected to the source of the transistor T1. The capacitor C1 is electrically connected between the gate and the source of the transistor T2. The anode of the organic electro-luminescent device LD1 is electrically connected to the source of the transistor T2, and the cathode of the organic electro-luminescent device LD1 is electrically connected to the ground voltage.

In one embodiment of the present invention, the first signal lines (e.g., 131, 133, 135, 137) may be the power lines VDD, the second signal lines (e.g., 141, 143, 145, 147) may be the gate lines VG, and the third signal lines (e.g., 151, 153, 155, 157) may be the data lines VS. The driving voltage of the data lines VS may be transmitted via the third signal lines (e.g., 151, 153, 155, 157), i.e., the source of the transistor T1 may be correspondingly and electrically connected to one of the third signal lines (e.g., 151, 153, 155, 157). The driving voltage of the gate lines VG may be transmitted via the second signal lines (e.g., 141, 143, 145, 147), i.e., the gate of the transistor T1 may be correspondingly and electrically connected to one of the second signal lines (e.g., 141, 143, 145, 147). In addition, in an embodiment, the gate lines VG and the data lines VS may be interchanged.

Since the fabrication method of the organic electro-luminescent device LD1 is integrated into the fabricating process of the first signal lines (e.g., 131, 133, 135, 137), the second signal lines (e.g., 141, 143, 145, 147) and the third signal lines (e.g., 151, 153, 155, 157), the organic electro-luminescent device LD1 may be simultaneously formed during the forming of signal lines (e.g., the first signal lines, the second signal lines and the third signal lines). In an embodiment of the present invention, after the electrical inspection is performed on the signal lines (e.g., the first signal lines, the second signal lines and the third signal lines), the light-on testing may be performed on the organic electro-luminescent device LD1.

Figure 7:
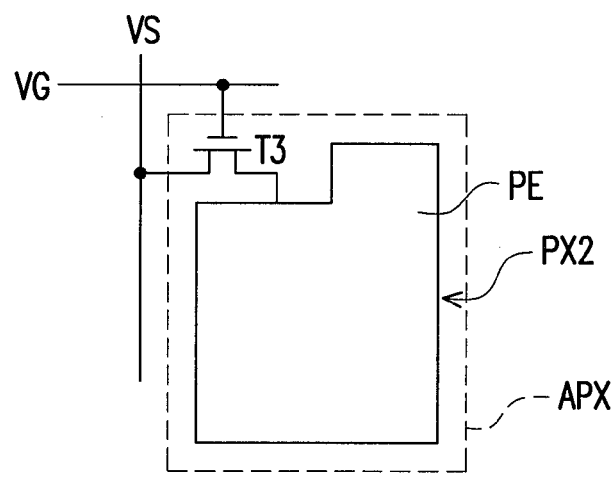
FIG. 7 is a schematic view of a pixel structure of a display panel according to one exemplary embodiment of the present invention.

FIG. 7 is a schematic view of a pixel structure of a display panel according to one exemplary embodiment of the present invention. Taking the display panel of the liquid crystal display device as an example, referring to FIG. 1 and FIG. 7, in the present embodiment, a pixel structure PX2 is disposed in each of the pixel regions APX. Each of the pixel structures PX2 includes a transistor T3 and a transparent pixel electrode PE. The drain of the transistor T3 receives the corresponding source driving voltage VS. The gate of the transistor T3 receives the corresponding gate driving voltage VG. The source of the transistor T3 is electrically connected to the transparent pixel electrode PE. In addition, given the display panel 100 is a liquid crystal display panel, the voltage level of the transparent pixel electrode PE may determine the tilt angle of liquid crystal. In other words, the voltage level of the transparent pixel electrode PE may determine the brightness displayed by each pixel, but the present embodiment is not limited thereto.

In one embodiment of the present invention, the first signal lines (e.g., 131, 133, 135, 137) may be the common voltage lines Vcom (not shown). The second signal lines (e.g., 141, 143, 145, 147) may be the gate lines VG. The third signal lines (e.g., 151, 153, 155, 157) may be the data lines VS. Herein the driving voltage of the gate lines VG may be transmitted through the corresponding second signal lines (e.g., 141, 143, 145, 147), i.e., the gate of the transistor T3 is correspondingly and electrically connected to one of the second signal lines (e.g., 141, 143, 145, 147). The driving voltage of the data lines VS may be transmitted via the third signal lines (e.g., 151, 153, 155, 157), i.e., the source of the transistor T3 may be correspondingly and electrically connected to one of the third signal lines (e.g., 151, 153, 155, 157). And when the transistor T3 is switched on, the transparent pixel electrode PE may be correspondingly and electrically connected to one of the third signal lines (e.g., 151, 153, 155, 157). In addition, in an embodiment, the gate lines VG and the data lines VS may be interchanged.

Figure 8:
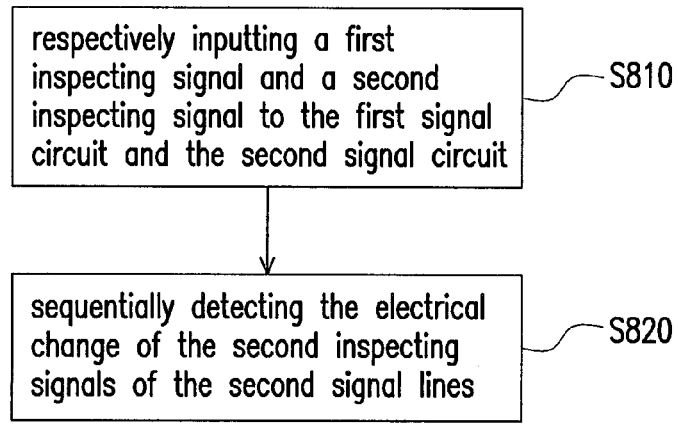
FIG. 8 is a flow chart of a method for inspecting a semi-finished display panel according to one exemplary embodiment of the present invention.

Accordingly, an inspecting method of a semi-finished display panel can be categorized so as to perform inspection on the display panels illustrated in FIG. 1 to FIG. 5. FIG. 8 is a flow chart of a method for inspecting a semi-finished display panel according to one exemplary embodiment of the present invention. Referring to FIG. 8, in the present embodiment, a first inspecting signal and a second inspecting signal are respectively input to the first signal circuit and the second signal circuit (step S810), wherein the first signal circuit includes a plurality of second signal lines. Next, the electrical change of the second inspecting signal of the second signal lines is sequentially detected (step S820) so as to detect the status of the second signal lines.

Figure 9:
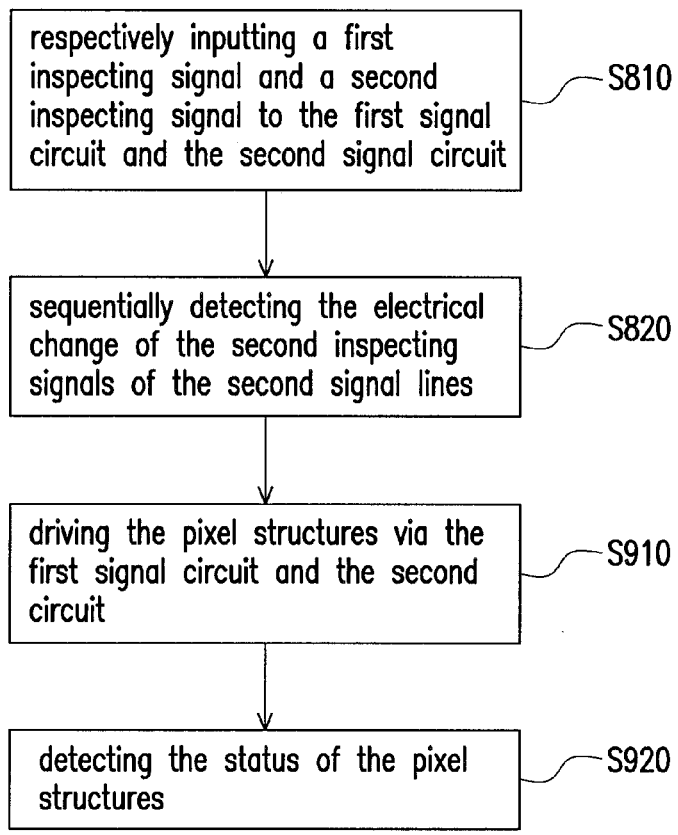
FIG. 9 is a flow chart of a method for inspecting a semi-finished display panel according to another exemplary embodiment of the present invention.

In addition, according to the illustration of the embodiment of FIG. 6, if the display devices and the signal circuits are simultaneously formed, then light-on testing may be further performed on the signal circuits and the pixel structures. FIG. 9 is a flow chart of a method for inspecting a semi-finished display panel according to another exemplary embodiment of the present invention. Referring to FIG. 8 and FIG. 9, in the present embodiment, the method for inspecting a semi-finished display panel further includes step S910 and step S920. In step S910, the pixel structures of the display panel are driven via the aforementioned signal circuits. In step S920, the status of the pixel structures is detected.

Herein the order of the aforementioned steps S810, S820, S910 and S920 is only for descriptions, and the present invention should not be limited thereto. Herein the details of the aforementioned steps S810, S820, S910 and S920 may be referred to the descriptions of the embodiments in FIG. 1 to FIG. 7, and it is not repeated herein.

In light of the foregoing, according to the display panel and the method for inspecting the semi-finished product thereof illustrated in the embodiments of the present invention, if the interval between line widths of the first signal circuit and the second signal circuit is too small or too close, the plurality of second signal lines of the second signal circuit may be electrically connected to the corresponding first resistors, or electrically connected to the corresponding first transistors and second transistors, in order that the electrical property of the first signal circuit may be different from the electrical property of the second signal circuit. Therefore, by distinguishing the measurement results into the corresponding first signal circuit or the corresponding second signal circuit through the difference of the electrical properties, the defect due to open-circuit or short-circuit may be inspected more accurately. The capabilities of inspecting circuit defect may be greatly improved and the yield of products may further be significantly increased. In addition, the first signal lines of the first signal circuit may be electrically connected to one another via at least one bridge line, so that the electrical properties of the first signal lines may be more consistent. Furthermore, if the two opposite ends of each second signal line are respectively and electrically connected by the first resistor and the second resistor, the resistance and capacitance load of the display panel can be balanced.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A display panel having a display region and a peripheral region located outside the display region, the display region comprising a plurality of pixel regions arranged in an array, the display panel comprising:
   a first signal circuit disposed in the display region and the peripheral region, wherein the first signal circuit comprises a plurality of first signal lines disposed in parallel along a first direction, and the first signal lines are electrically connected to one another;
   a second signal circuit disposed in the display region and the peripheral region, wherein the second signal circuit comprises a plurality of second signal lines disposed in parallel along the first direction, and the second signal lines and the first signal lines are alternately disposed in parallel with one another; and a plurality of first resistors disposed in the peripheral region, each of the second signal lines connected to at least one of the first resistors, wherein an interval between the first signal line and the second signal line is smaller than 60 μm, and a difference between a first resistance of the first signal line and a second resistance of the second signal line is ranged from 30 ohm to 30000 ohm.

2. The display panel as claimed in claim 1, wherein the difference between the first resistance of the first signal line and the second resistance of the second signal line is ranged from 50 ohm to 1000 ohm.

3. The display panel as claimed in claim 1, wherein the difference between the first resistance of the first signal line and the second resistance of the second signal line is ranged from 100 ohm to 500 ohm.

4. The display panel as claimed in claim 1, further comprising a plurality of pixel structures disposed in the corresponding pixel regions, wherein each of the pixel structures comprises:
a display device; and
an active device electrically connected to the display device, wherein the active device is correspondingly and electrically connected to one of the second signal lines.

5. The display panel as claimed in claim 4, wherein the display device comprises an organic electro-luminescent device.

6. The display panel as claimed in claim 1, wherein the first signal circuit comprises a power line circuit.

7. The display panel as claimed in claim 1, further comprising a plurality of pixel structures disposed in the corresponding pixel regions, wherein each of the pixel structures comprises:
an active device; and
a transparent pixel electrode electrically connected to the active device, wherein the active device is correspondingly and electrically connected to one of the second signal lines.

8. The display panel as claimed in claim 1, further comprising a first bridge line located in the peripheral region and electrically connecting the first signal lines.

9. The display panel as claimed in claim 8, further comprising a second bridge line located in the peripheral region, wherein the first bridge line and the second bridge line are respectively located at two opposite sides of the display region, the first bridge line electrically connects a first end of each of the first signal lines, and the second bridge line electrically connects a second end of each of the first signal lines.

10. The display panel as claimed in claim 1, further comprising a plurality of first pads and a plurality of second pads located in the peripheral region, wherein the first pads and the second pads are electrically connected to the first signal lines and the second signal lines, respectively.

11. The display panel as claimed in claim 1, further comprising a plurality of second resistors respectively connected to the corresponding second signal lines in series, wherein each of the first resistors and each of the second resistors are electrically connected to two opposite ends of the corresponding second signal line, respectively.

12. The display panel as claimed in claim 11, wherein the second resistors are located in the peripheral region.

13. The display panel as claimed in claim 11, wherein a first resistance of each of the first resistors and a second resistance of each of the second resistors are substantially the same.

14. The display panel as claimed in claim 1, further comprising:

a third signal circuit disposed in the display region and the peripheral region, wherein the third signal circuit comprises a plurality of third signal lines disposed in parallel along the first direction, and the third signal lines and the first signal lines are alternately disposed in parallel with one another; and
a plurality of third resistors disposed in the peripheral region, each of the third signal lines being connected to at least one of the third resistors, wherein an interval between the first signal line and the third signal line is smaller than 60 μm, and a difference between a first resistance of the first signal line and a third resistance of the third signal line is ranged from 30 ohm to 30000 ohm.

15. The display panel as claimed in claim 14, wherein the difference between the first resistance of the first signal line and the third resistance of the third signal line is ranged from 50 ohm to 1000 ohm.

16. The display panel as claimed in claim 14, wherein the difference between the first resistance of the first signal line and the third resistance of the third signal line is ranged from 100 ohm to 500 ohm.

17. The display panel as claimed in claim 14, further comprising a plurality of fourth resistors respectively connected to the corresponding third signal lines in series, wherein each of the third resistors and each of the fourth resistors are electrically connected to two opposite ends of the corresponding third signal line, respectively.

18. The display panel as claimed in claim 17, wherein the fourth resistors are located in the peripheral region.

19. The display panel as claimed in claim 17, wherein a third resistance of each of the third resistors and a fourth resistance of each of the fourth resistors are substantially the same.

20. A method for performing electrically inspection on a semi-finished display panel, the display panel comprising:
a substrate having a display region and a peripheral region located outside the display region, the display region comprising a plurality of pixel regions arranged in an array;
a first signal circuit disposed in the display region and the peripheral region, wherein the first signal circuit comprises a plurality of first signal lines disposed in parallel along a first direction, and the first signal lines are electrically connected to one another;
a second signal circuit disposed in the display region and the peripheral region, wherein the second signal circuit comprises a plurality of second signal lines disposed in parallel along the first direction, and the second signal lines and the first signal lines are alternately disposed in parallel with one another; and
a plurality of first resistors disposed in the peripheral region, each of the second signal lines connected to at least one of the first resistors, wherein an interval between the first signal line and the second signal line is smaller than 60 μm, and a difference between a first resistance of the first signal line and a second resistance of the second signal line is ranged from 30 ohm to 30000 ohm;
the method comprising:
respectively inputting a first inspecting signal and a second inspecting signal to the first signal circuit and the second signal circuit; and
sequentially detecting an electrical change of the second inspecting signals of the second signal lines.

21. The method as claimed in claim 20, further comprising electrically connecting an external resistor to each of the second signal lines before the step of respectively inputting a first inspecting signal and a second inspecting signal to the first signal circuit and the second signal circuit.

22. The method as claimed in claim 20, wherein the display panel further comprises a plurality of pixel structures disposed in the corresponding pixel regions, the method further comprising:
   driving the pixel structures by the first signal circuit and second signal circuit; and
   detecting a status of the pixel structures.

23. The method as claimed in claim 20, wherein the difference between the first resistance of the first signal line and the second resistance of the second signal line is ranged from 50 ohm to 1000 ohm.

24. The method as claimed in claim 20, wherein the difference between the first resistance of the first signal line and the second resistance of the second signal line is ranged from 100 ohm to 500 ohm.

25. The method as claimed in claim 20, wherein the display panel further comprises a first bridge line located in the peripheral region and electrically connecting the first signal lines.

26. The method as claimed in claim 25, wherein the display panel further comprises a second bridge line located in the peripheral region, the first bridge line and the second bridge line are respectively located at two opposite sides of the display region, the first bridge line is electrically connected to a first end of each of the first signal lines, and the second bridge line is electrically connected to a second end of each of the first signal lines.

27. The method as claimed in claim 20, wherein the display panel further comprises a plurality of second resistors respectively connected to the corresponding second signal lines in series, and each of the first resistors and each of the second resistors are electrically connected to two opposite ends of the corresponding second signal line, respectively.

28. The method as claimed in claim 27, wherein a first resistance of each of the first resistors and a second resistance of each of the second resistors are substantially the same.

29. The method as claimed in claim 20, wherein the display panel further comprises:
   a third signal circuit disposed in the display region and the peripheral region, wherein the third signal circuit comprises a plurality of third signal lines disposed in parallel along the first direction, and the third signal lines and the first signal lines are alternately disposed in parallel with one another; and
   a plurality of third resistors disposed in the peripheral region, each of the third signal lines being connected to at least one of the third resistors, wherein an interval between the first signal line and the third signal line is smaller than 60 μm, and a difference between a first resistance of the first signal line and a third resistance of the third signal line is ranged from 30 ohm to 30000 ohm.

30. The method as claimed in claim 29, wherein the difference between the first resistance of the first signal line and the third resistance of the third signal line is ranged from 50 ohm to 1000 ohm.

31. The method as claimed in claim 29, wherein the difference between the first resistance of the first signal line and the third resistance of the third signal line is ranged from 100 ohm to 500 ohm.

32. The method as claimed in claim 29, wherein the display panel further comprises a plurality of fourth resistors located in the peripheral region and respectively connected to the corresponding third signal lines in series, and each of the third resistors and each of the fourth resistors are electrically connected to two opposite ends of the corresponding third signal line, respectively.

33. The method as claimed in claim 32, wherein a third resistance of each of the third resistors and a fourth resistance of each of the fourth resistors are substantially the same.

* * * * *